(12) United States Patent
Yoon et al.

(10) Patent No.: US 11,404,727 B2
(45) Date of Patent: Aug. 2, 2022

(54) METHOD FOR EVALUATING INTERNAL SHORT OF SECONDARY BATTERY

(71) Applicant: LG CHEM, LTD., Seoul (KR)

(72) Inventors: Seo Young Yoon, Daejeon (KR); Byung Soo Kim, Daejeon (KR); Ju Bin Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 66 days.

(21) Appl. No.: 16/970,398

(22) PCT Filed: Sep. 30, 2019

(86) PCT No.: PCT/KR2019/012718
§ 371 (c)(1),
(2) Date: Aug. 17, 2020

(87) PCT Pub. No.: WO2020/091238
PCT Pub. Date: May 7, 2020

(65) Prior Publication Data
US 2021/0119269 A1 Apr. 22, 2021

(30) Foreign Application Priority Data
Nov. 2, 2018 (KR) .................. 10-2018-0133648

(51) Int. Cl.
*H01M 10/42* (2006.01)
*G01R 19/165* (2006.01)
(Continued)

(52) U.S. Cl.
CPC ........ *H01M 10/425* (2013.01); *G01R 19/165* (2013.01); *H01M 4/133* (2013.01);
(Continued)

(58) Field of Classification Search
None
See application file for complete search history.

(56) References Cited

U.S. PATENT DOCUMENTS 10,895,606 B1 * 1/2021 Patrissi .................. G01R 31/52
2008/0254341 A1 * 10/2008 Bailey ............... H01M 8/04201
429/407
(Continued)

FOREIGN PATENT DOCUMENTS

CN 103076364 B 12/2015
JP 2002-515637 A 5/2002
(Continued)

OTHER PUBLICATIONS

International Search Report (with parital translation) and Written Opinion issued in corresponding International Patent Application No. PCT/KR2019/012718, dated Jan. 8, 2020.
(Continued)

*Primary Examiner* — Amanda J Barrow
(74) *Attorney, Agent, or Firm* — Morgan, Lewis & Bockius LLP (57) ABSTRACT

A method for evaluating an internal short, of the present invention, inserts ionic polymer-metal composites (IPMC) in a battery cell, and applies a voltage to an external conducting wire electrically connected to the IPMC, so as to induce an internal short by means of flexural deformation of the IPMC, thereby evaluating whether the internal short occurs. The method for evaluating an internal short, according to the present invention, inserts and positions, in a battery, the IPMC capable of operating even at room temperature and low voltages and adjusts the voltage, thereby having an advantage of enabling a short to occur at a desired position and area and for a desired period of time.

10 Claims, 5 Drawing Sheets

(51) Int. Cl.
  *H01M 50/536* (2021.01)
  *H01M 4/137* (2010.01)
  *H01M 4/133* (2010.01)
  *H01M 4/134* (2010.01)

(52) U.S. Cl.
  CPC ........... *H01M 4/134* (2013.01); *H01M 4/137* (2013.01); *H01M 50/536* (2021.01)

(56) References Cited

U.S. PATENT DOCUMENTS

| | | | |
|---|---|---|---|
| 2009/0029261 A1 | 1/2009 | Thomas-Alyea et al. | |
| 2009/0286148 A1* | 11/2009 | Fujikawa | G01R 31/52 429/149 |
| 2013/0127473 A1* | 5/2013 | Ikeda | H01M 10/48 324/426 |
| 2013/0209841 A1* | 8/2013 | Keyser | H01M 10/4285 429/50 |
| 2014/0272530 A1 | 9/2014 | Manning et al. | |
| 2018/0045184 A1* | 2/2018 | Must | F03G 7/005 |
| 2020/0341074 A1* | 10/2020 | Lee | H01M 50/569 |

FOREIGN PATENT DOCUMENTS

| | | |
|---|---|---|
| JP | 2008-041264 A | 2/2008 |
| JP | 2013-190220 A | 9/2013 |
| JP | 2017-059464 A | 3/2017 |
| JP | 2018-085245 A | 5/2018 |
| JP | 2018-137141 A | 8/2018 |
| KR | 10-2006-0039955 A | 5/2006 |
| KR | 10-2009-0071664 A | 7/2009 |
| KR | 10-2009-0130412 A | 12/2009 |
| KR | 10-2010-0013811 A | 2/2010 |
| KR | 10-2010-0118189 A | 11/2010 |
| KR | 10-2011-0070906 A | 6/2011 |
| KR | 10-2012-0105233 A | 9/2012 |
| KR | 10-2013-0030807 A | 3/2013 |
| KR | 10-2015-0028632 A | 3/2015 |
| KR | 10-2015-0041840 A | 4/2015 |
| WO | 2012/117660 A1 | 9/2012 |

OTHER PUBLICATIONS

Office Action issued in corresponding Korean Patent Application No. 10-2018-0133648 dated Nov. 17, 2021.

* cited by examiner

METHOD FOR EVALUATING INTERNAL SHORT OF SECONDARY BATTERY

TECHNICAL FIELD

This application is a National Phase filing under 35 U.S.C. § 371 of PCT/KR2019/012718 filed on Sep. 30, 2019, and claims the benefit of priority based on Korean Patent Application No. 10-2018-0133648, filed on Nov. 2, 2018, and the entire contents of the Korean patent application are incorporated herein by reference.

The present invention relates to a method for evaluating internal short circuit of a secondary battery, and more particularly, to an evaluation method capable of measuring a short circuit of a battery in various states and environments by inserting an electroactive polymer into a battery and inducing internal short circuits due to structural deformation thereof.

BACKGROUND ART

As the price of energy sources increases due to depletion of fossil fuels and the interest in environmental pollution increases, the demand for environmentally friendly alternative energy sources becomes an indispensable factor for future life. Especially, as technology development and demand for mobile devices are increasing, demand for secondary batteries as energy sources is rapidly increasing.

Typically, in terms of the shape of the battery, there is a high demand for a prismatic secondary battery and a pouch-type secondary battery that can be applied to products such as mobile phones with a small thickness. In terms of materials, there is a high demand for lithium secondary batteries such as lithium ion batteries and lithium ion polymer batteries having high energy density, discharge voltage, and output stability.

There is a growing interest in the stability of secondary batteries. The lithium secondary battery has a problem of low safety while having excellent electrical properties. For example, lithium secondary batteries generate heat and gas due to decomposition reaction of active materials and electrolytes, which are battery components, under abnormal operating conditions such as overcharge, overdischarge, exposure to high temperatures and short circuit, and the resulting high temperature and high pressure conditions further promote the decomposition reaction and sometimes cause a fire or explosion.

In addition, it is very important to secure the stability even when an internal short circuit occurs in the battery, and for this purpose, it is important to correctly evaluate the stability of the secondary battery when the internal short circuit occurs. As a battery stability item for lithium secondary batteries, details about a battery evaluation test for evaluating heat generation behavior during internal short circuits are explained in UL Standard for Lithium Batteries (UL1642), Guidelines from the Battery Industry Association (SBA G1101-1997 Lithium Secondary Battery Stability Evaluation Criteria Guidelines), etc.

Conventionally, in the internal short circuit evaluation test, there existed a nail penetration test, a crush test, a shape memory alloy utilization test, and the like. The nail penetration test is to intentionally cause a short circuit inside the secondary battery by loading the secondary battery into a test device capable of measuring the temperature and voltage of the secondary battery, and then penetrating the secondary battery with a sharp metal nail having various diameters prepared in advance, then to measure the temperature and voltage change of the secondary battery according to the diameter and the penetration rate of the nail, and to visually check whether the secondary battery is ignited. The crush test is a test for measuring changes in battery temperature or voltage by causing internal short circuits between the positive electrode plate and the negative electrode plate by physically deforming the battery using round bars, square bars, and flat plates. In the case of the internal short circuit test using the shape memory alloy, when the shape memory alloy is installed in the battery and heated above a specific temperature, the shape of the shape memory alloy is changed to physically destroy the insulating layer to determine whether the internal short circuit of the battery has occurred. However, in the case of the nail penetration test and the crush test, when the internal separator is penetrated in advance, a desired reaction may not occur due to a chemical reaction in the part where the separator is broken, and in the case of a test using a shape memory alloy, there is a limit that the battery should be heated above a certain temperature or a high temperature atmosphere should be set.

DISCLOSURE

Technical Problem

Therefore, the present invention was devised to solve the above problems, and an object of the present invention is to provide an internal short circuit evaluation method capable of performing evaluation at room temperature and atmospheric pressure by inserting and placing ion polymer-metal composites (IPMC) in the cell, capable of evaluating internal short circuit in various applied voltages and environments, and capable of evaluating internal short circuit as much as the evaluator wants, in a desired position, for the desired area size and for a desired period of time.

Other objects and advantages of the present invention can be understood by the following description, and will be more clearly understood by the embodiments of the present invention. It will also be readily appreciated that the objects and advantages of the invention may be realized by the means and combinations thereof indicated in the claims.

Technical Solution

The present invention provides a method for evaluating an internal short circuit of a secondary battery cell having a structure in which an electrode assembly of a positive electrode/separator/negative electrode is built in a battery case and the electrode tab of the electrode assembly is coupled to an electrode lead and is sealed to be protruded to an outside, characterized in that by inserting an ionic polymer-metal composite (IPMC) inside the battery cell and applying a voltage to an external conductor electrically connected to the ionic polymer-metal composite, an internal short circuit is induced by bending deformation of the ionic polymer-metal composite.

Herein, the ionic polymer-metal composite (IPMC) may be formed of a metal electrode coated on both sides of the polymer electrolyte membrane, and a polymer electrolyte membrane may include one selected from the group consisting of: sulfonated tetrafluoroethylene including Nafion, Flemion and Aciplex; sulfonated styrenic block copolymer including sulfonated poly (styrene-co-ethylene) (SPSE); sulfonated styrenic triblock copolymer including sulfonated poly (styrene-b-ethylene-co-butylene-b-styrene) (SSEBS); sulfonated styrenic pentablock copolymer (SSPB); a blend (PMSI/PVDF) of styrene-maleimide alternating copolymer with polyvinylidene fluoride (PVDF); and a blend (SPEEK/PVDF) of sulfonated poly (ether ether ketone) with polyvinylidene fluoride (PVDF).

Meanwhile, one selected from the group consisting of montmorillonite (MMT), silica, alumina, carbon nanotube (CNT), fullerene (C60), and graphene may be mixed with the nafion.

Further, the metal electrode may be one selected from the group consisting of platinum, gold, palladium, and silver.

According to another example of the present invention, the ionic polymer-metal composite may be inserted into at least one position between the separator and the electrode to induce an internal short circuit by energizing the positive electrode and the negative electrode.

According to further another example of the present invention, the ionic polymer-metal composite may be inserted into at least one position between the separator and the negative electrode to induce an internal short circuit by energizing a positive electrode lead and the negative electrode.

According to further another example of the present invention, the ionic polymer-metal composite may be inserted into at least one position between the separator and the positive electrode to induce an internal short circuit by energizing a negative electrode lead and the positive electrode.

Further, in the method of evaluating the internal short circuit, an occurrence of the internal short circuit may be detected by detecting a voltage drop.

Further, an application range of the voltage may be 0.01 to 5.00V, more preferably 1 to 1.23 V.

On the other hand, the present invention provides a battery characterized in that an electrode assembly, which includes two or more unit electrodes including a positive electrode or a negative electrode and is wound with a separator interposed between the unit electrodes, is built in a battery case, and the ionic polymer-metal composite (IPMC) has been inserted into a battery cell. The battery cell may be a cylindrical, square or pouch type battery cell.

In the present invention, the unit electrode may be manufactured by applying an electrode mixture containing an electrode active material on a current collector and then drying the electrode mixture. The electrode mixture may further include a binder, a conductive material, a filler, and the like, as necessary.

In the present invention, both weak magnetic and non-magnetic metal ultrathins may be used as the current collector. The positive electrode collector generally has a thickness of 3 to 500 micrometers. The positive electrode current collector is not particularly limited as long as it has high conductivity without causing a chemical change in the battery. Examples of the positive electrode current collector include stainless steel, aluminum, nickel, titanium, or aluminum or stainless steel of which the surface has been treated with carbon, nickel, titanium, silver, or the like. The current collector may have fine irregularities on the surface thereof to increase the adhesion of the positive electrode active material, and various forms such as a sheet, a foil, and a net are possible.

The negative electrode collector generally has a thickness of 3 to 500 micrometers. The negative electrode current collector is not particularly limited as long as it has electrical conductivity without causing chemical changes in the battery, and examples thereof include copper, stainless steel, aluminum, nickel, titanium, sintered carbon, copper or stainless steel of which the surface has been treated with carbon, nickel, titanium, silver or the like, aluminum-cadmium alloy, or the like. In addition, like the positive electrode current collector, fine unevenness can be formed on the surface to enhance the bonding force of the negative electrode active material, and it can be used in various forms such as a sheet, a foil, and a net.

In the present invention, the positive electrode active material is a material capable of causing an electrochemical reaction and a lithium transition metal oxide, and contains two or more transition metals. Examples thereof include: layered compounds such as lithium cobalt oxide ($LiCoO_2$) and lithium nickel oxide ($LiNiO_2$) substituted with one or more transition metals; lithium manganese oxide substituted with one or more transition metals; lithium nickel oxide represented by the formula $LiNi_{1-y}M_yO_2$ (wherein M=Co, Mn, Al, Cu, Fe, Mg, B, Cr, Zn or Ga and contains at least one of the above elements, $0.01 \leq y \leq 0.7$); lithium nickel cobalt manganese composite oxide represented by the formula $Li_{1+z}Ni_bMn_cCo_{1-(b+c+d)}M_dO_{(2-e)}A_e$ such as $Li_{1+z}Ni_{1/3}Co_{1/3}Mn_{1/3}O_2$, $Li_{1+z}Ni_{0.4}Mn_{0.4}Co_{0.2}O_2$ etc. (wherein $-0.5 \leq z \leq 0.5$, $0.1 \leq b \leq 0.8$, $0 \leq d \leq 0.2$, $0 \leq e \leq 0.2$, b+c+d<1, M=Al, Mg, Cr, Ti, Si or Y, and A=F, P or Cl); olivine-based lithium metal phosphate represented by the formula $Li_{1+x}M_{1-y}M'_yPO_{4-z}X_z$ (wherein M=transition metal, preferably Fe, Mn, Co or Ni, M'=Al, Mg or Ti, X=F, S or N, and $-0.5 \leq x \leq 0.5$, $0 \leq y \leq 0.5$, $0 \leq z \leq 0.1$).

Examples of the negative electrode active material include carbon such as non-graphitized carbon and graphite carbon; metal complex oxide such as $Li_xFe_2O_3 (0 \leq x \leq 1)$, $Li_xWO_2 (0 \leq x \leq 1)$, $Sn_xMe_{1-x}Me'_yO_z$ (Me: Mn, Fe, Pb, Ge; Me': Al, B, P, Si, groups 1, 2, and 3 of the periodic table, halogen; $0 \leq x \leq 1$; $1 \leq y \leq 3$; $1 \leq z \leq 8$); lithium alloy; silicon alloy; tin alloy; metal oxides such as SnO, $SnO_2$, PbO, $PbO_2$, $Pb_2O_3$, $Pb_3O_4$, $Sb_2O_3$, $Sb_2O_4$, $Sb_2O_5$, GeO, $GeO_2$, $Bi_2O_3$, $Bi_2O_4$, and $Bi_2O_5$; conductive polymers such as polyacetylene; and Li—Co—Ni-based materials.

The conductive material is usually added in an amount of 1 to 30% by weight based on the total weight of the mixture including the positive electrode active material. Such a conductive material is not particularly limited as long as it has electrical conductivity without causing a chemical change in the battery, and examples thereof include graphite such as natural graphite and artificial graphite; carbon black such as carbon black, acetylene black, Ketjen black, channel black, furnace black, lamp black, and summer black; conductive fibers such as carbon fiber and metal fiber; metal powders such as carbon fluoride, aluminum and nickel powder; conductive whiskey such as zinc oxide and potassium titanate; conductive metal oxides such as titanium oxide; and conductive materials such as polyphenylene derivatives and the like.

The binder is added in an amount of 1 to 30% by weight, on the basis of the total weight of the mixture containing the positive electrode active material, as a component that assists in bonding between the active material and the conductive material and bonding to the current collector. Examples of such binders include polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene terpolymer (EPDM), sulfonated EPDM, styrene butylene rubber, fluorine rubber, various copolymers and the like.

The filler is optionally used as a component for inhibiting expansion of an electrode, and is not particularly limited as long as it is a fibrous material without causing a chemical change in the battery. Examples of the filler include olefin polymers such as polyethylene and polypropylene; fibrous materials such as glass fibers and carbon fibers.

Other components, such as viscosity modifiers, adhesion promoters, and the like may be further included optionally or in combination of two or more. The viscosity modifier is a component that adjusts the viscosity of the electrode mixture so that the mixing process of the electrode mixture and the coating process on the current collector thereof may be easy, and may be added up to 30% by weight based on the total weight of the negative electrode mixture. Examples of such a viscosity modifier include carboxy methyl cellulose, polyvinylidene fluoride, and the like, but are not limited thereto. In some cases, the solvent described above may serve as a viscosity modifier.

The adhesion promoter is an auxiliary component added to improve the adhesion of the active material to the current collector and may be added in less than 10% by weight compared to the binder, and some examples thereof include oxalic acid, adipic acid, formic acid, acrylic acid derivatives, itaconic acid derivatives, and the like.

The separator is interposed between the positive electrode and the negative electrode, and an insulating thin film having high ion permeability and mechanical strength is used. The pore diameter of the separator is generally 0.01 to 10 micrometers, and the thickness is generally 5 to 300 micrometers. Examples of such a separator include olefin-based polymers such as polypropylene which is chemically resistant and hydrophobic; a sheet or a nonwoven fabric made of glass fiber, polyethylene or the like. When a solid electrolyte such as a polymer is used as the electrolyte, the solid electrolyte may also serve as a separator.

The lithium salt-containing non-aqueous electrolyte solution consists of an electrolyte and a lithium salt. And a non-aqueous organic solvent, an organic solid electrolyte, an inorganic solid electrolyte, and the like are used as the electrolyte solution.

Examples of the non-aqueous organic solvent include N-methyl-2-pyrrolidinone, propylene carbonate, ethylene carbonate, butylenecarbonate, dimethyl carbonate, diethyl carbonate, gamma-Butyrolactone, 1,2-dimethoxyethane, tetrahydroxyfuran, 2-methyltetrahydrofuran, dimethylsulfoxide, 1,3-dioxolane, formamide, dimethylformamide, dioxolane, acetonitrile, nitromethane, methyl formate, methyl acetate, phosphoric acid triester, trimethoxymethane, dioxolane derivatives, sulfolane, methyl sulfolane, 1,3-dimethyl-2-imidazolidinone, propylene carbonate derivatives, tetrahydrofuran derivatives, ethers, methyl pyrophosphate, ethyl propionate, etc.

Examples of the organic solid electrolyte include a polymer electrolyte such as a polyethylene derivative, a polyethylene oxide derivative, a polypropylene oxide derivative, a phosphate ester polymer, an agitation lysine, a polyester sulfide, a polyvinyl alcohol, a polyvinylidene fluoride, a polymerizer including an ionic dissociation group, and the like.

Examples of the inorganic solid electrolyte include nitrides, halides, and sulfates of Li such as $Li_3N$, $LiI$, $Li_5NI_2$, $Li_3N$—$LiI$—$LiOH$, $LiSiO_4$, $LiSiO_4$—$LiI$—$LiOH$, $Li_2SiS_3$, $Li_4SiO_4$, $Li_4SiO_4$—$LiI$—$LiOH$, and $Li_3PO_4$—$Li_2S$—$SiS_2$.

The lithium salt is a substance that is soluble in the non-aqueous electrolyte. The examples of the lithium salt include LiCl, LiBr, LiI, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $(CF_3SO_2)_2NLi$, chloroborane lithium, lower aliphatic carboxylic acid lithium, lithium 4-phenylborate, imide and the like.

For the purpose of improving charge/discharge characteristics, flame retardancy, etc., pyridine, triethylphosphite, triethanolamine, cyclic ether, ethylenediamine, n-glyme, hexaphosphoric triamide, nitrobenzene derivative, sulfur, quinone imine dye, N-substituted oxazolidinone, N,N-substituted imidazolidine, ethylene glycol dialkyl ether, ammonium salt, pyrrole, 2-methoxyethanol, aluminum trichloride, etc. may be added to the electrolyte. In some cases, a halogen-containing solvent such as carbon tetrachloride or ethylene trifluoride may be further added to impart nonflammability, or a carbon dioxide gas may be further added to improve the high-temperature storage characteristics, and FEC (Fluoro-EthyleneCarbonate), PRS (Propene sultone), and the like may be further added.

In one preferred example, a lithium salt such as $LiPF_6$, $LiClO_4$, $LiBF_4$, and $LiN(SO_2CF_3)_2$ may be added to a mixed solvent of a cyclic carbonate of EC or PC which is a high-dielectric solvent and a linear carbonate of DEC, DMC or EMC which is low viscosity solvent to thereby prepare a non-aqueous electrolyte containing a lithium salt.

Advantageous Effects

The internal short circuit evaluation method according to the present invention inserts and positions an ionic polymer-metal composite (IPMC) that can operate even at room temperature and under a low voltage, adjusts the applied voltage, and thereby enables a short circuit evaluation of a desired position, area, and time.

DETAILED DESCRIPTION OF THE PREFERRED EMBODIMENTS

The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention. Accordingly, the embodiments described in the specification and the configurations described in the drawings are only the most preferred embodiments of the present invention, and do not represent all of the technical ideas of the present invention. It is to be understood that there may be various equivalents and variations in place of them at the time of filing the present application.

In the present specification, when a part is "connected" to another part, this includes not only "directly connected" but also "electrically connected" between the parts while having another element therebetween.

Also, throughout the specification, when an element is referred to as "including" an element, it is understood that the element may include other elements as well unless specifically stated otherwise.

As used throughout this specification, the terms "about", "substantially", and the like, are used to mean a value or something like this when unique manufacturing and material tolerances are presented, and the terms are used to prevent unscrupulous infringers from unfair use of the disclosure including accurate or absolute figures in order to aid in the understanding of the present disclosure.

Throughout this specification, the term "combination(s) thereof" included in the expression of the Markush form means one or more mixtures or combinations selected from the group consisting of the elements described in the Markush form representation, and it means to include one or more selected from the group consisting of the above components.

The present invention provides a method for evaluating an internal short circuit of a secondary battery cell having a structure in which an electrode assembly of a positive electrode/separator/negative electrode is built in a battery case and the electrode tab of the electrode assembly is coupled to an electrode lead and is sealed to be protruded, characterized in that by inserting an ionic polymer-metal composite (IPMC) inside the battery cell and applying a voltage to an external conductor electrically connected to the ionic polymer-metal composite, an internal short circuit is induced by bending deformation of the ionic polymer-metal composite.

Conventionally, in order to evaluate an internal short circuit of a battery, a method of artificially disassembling the battery and physically damaging the separator or the like, or installing a shape memory alloy inside the battery has been used. However, There was a problem that the precision of the experimental results was lowered due to side reactions due to chemical reaction of the damaged part in the process of reassembling the physically damaged batteries, and in the case of using a shape memory alloy to compensate for this, there was a problem in that the experiment temperature should be set high.

Therefore, the present invention uses an electroactive polymer, specifically, an ionic polymer-metal composite (IPMC) as a test material for internal short circuit evaluation of a battery, so that it can be operated under normal temperature and low voltage, and can be miniaturized to facilitate handling. In addition, by adjusting the applied voltage, a short circuit evaluation by the user's desired position, area, and time is possible.

In general, an electroactive polymer (EAP) is a material which is mechanically deformed when electrically stimulated, and, at the same time, is a material which may send an electric signal when mechanically deformed. The material having characteristics similar to those of the electroactive polymer is typically a shape memory alloy, but there is a limitation due to environmental limitations due to the deformation occurring under a certain temperature or more by heating. In contrast, electroactive polymers have a relatively high degree of deformation and are characterized by excellent toughness and fast response.

Electroactive polymers are classified into electronic electroactive polymers activated by an electric field and ionic electroactive polymers activated by ion transport according to their driving method. First of all, electronic EAP is a polymer whose volume is increased or decreased by coulombic force caused by an electric field. It can induce a relatively large force, has excellent mechanical properties, and reacts and operates within seconds in air. In addition, the deformed state of the polymer can be maintained for a long time with the series voltage. As such, it has been mainly applied to industrial and military robots. However, this has the disadvantage of requiring a relatively high driving voltage of more than a few hundred to several thousand volts but not having a large degree of deformation.

On the other hand, ionic electroactive polymers can be operated at higher displacements and lower voltages than electronic electroactive polymers, and they are simple in structure and advantageous in miniaturization. As such, application to miniaturized robot parts and biomimetic artificial muscles has been studied.

Some examples of the ionic electroactive polymers include ionic polymer gels, conducting polymers, ionic polymer-metal composites (IPMCs), and carbon nanotubes (CNTs). Specifically, the ionic polymer gel has a modulus of elasticity as the polymer forms a network through a cross-linking reaction, so that the ionic polymer gel maintains its shape and at the same time, the properties of the swelled material are changed and deformation occurs according to external environmental conditions such as temperature, solvent, pH, and electric field. Representative examples include polyacrylic acid, polyacrylonitrile and the like. The conducting polymer (CP) is deformed mainly due to the volume change due to the movement of ions during redox, and representative examples thereof include polypyrrole (PPy), polyaniline (PANI), and polythiophene (PTh). Ionic polymer-metal composites (IPMC) are representative ionic electroactive polymers that exhibit large bending strains when low electric fields are applied. The ionic polymer-metal composite generally has a structure in which metal electrodes are located on both sides of a polymer electrolyte membrane. A typical example thereof is an IPMC having a platinum electrode coated on a Nafion polymer film, and Nafion is chemically very stable and shows large deformations in both AC and DC voltages.

In the present invention, it is preferable to use an electroactive polymer, specifically, an ionic polymer-metal composite (IPMC), as a material for inducing internal short circuit of a battery. The IPMC is advantageous in miniaturization, and has a feature of exhibiting large bending deformation even when a low electric field is applied.

Hereinafter, a method for evaluating an internal short circuit of a secondary battery according to an embodiment of the present invention will be described with reference to the drawings.

Figure 3:
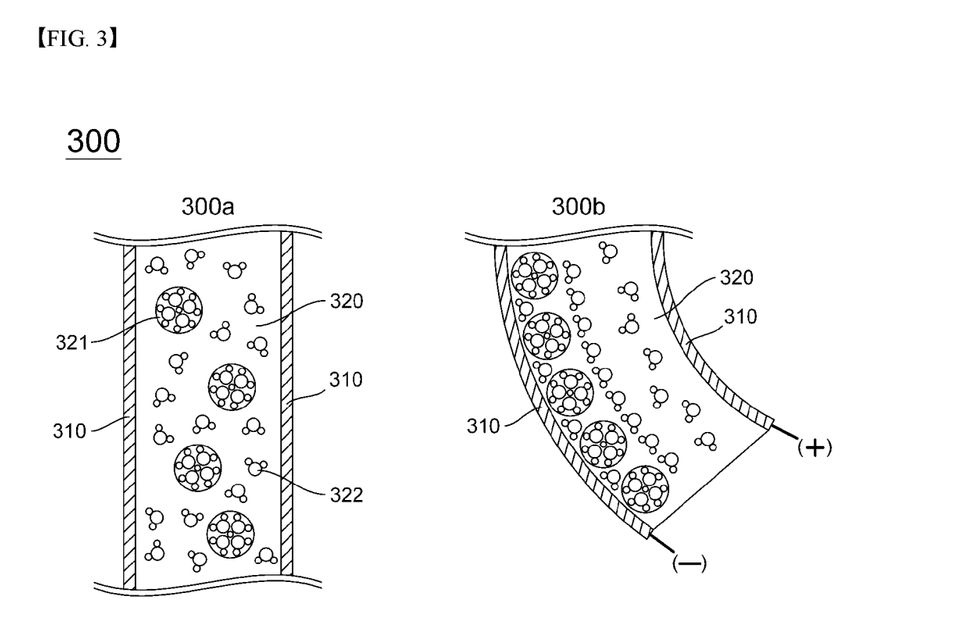
FIG. 3 is a diagram schematically showing the shape and operating principle of the ionic polymer-metal composite (IPMC) according to the present invention.

First, FIG. 3 is a diagram schematically showing the shape and operating principle of the ionic polymer-metal composite (IPMC) according to the present invention.

In general, the ionic polymer-metal composite (IPMC) is composed of a polymer electrolyte membrane (or ion exchange membrane) 320 and a metal electrode 310 plated on both surfaces of the membrane, as shown in 300a of FIG. 3. Depending on the manufacturing technique, the number, thickness, etc. of these layers may vary. The polymer electrolyte membrane 320 is a polymer membrane composed of cations and anions, and includes a cation exchange membrane in which cations move and an anion exchange membrane in which anions move. A cation exchange membrane, in which cations move, is generally used for the IPMC and is used in a state where cations are hydrated by impregnating an internal solvent such as distilled water. A typical cation exchange membrane is composed of Nafion, a polymer developed by Du Pont, which has a structure in which a sulfone group is chemically bonded to the main chain of a fluorine-based polymer, and hydrogen ions can freely move.

In the present invention, the metal electrode is generally a precious metal deposited on the polymer electrolyte membrane by electroless plating.

In the present invention, it is preferable to use platinum as the material of the metal electrode.

On the other hand, as the length of the IPMC increases, the effect of bending deformation increases, and thus the damage area of the separator is increased, so that the damage area can be adjusted.

Specifically, referring to 300a of FIG. 3, the hydrated cations 321 are evenly distributed throughout the polymer electrolyte membrane 320 before an electric field or voltage is applied.

300b of FIG. 3 illustrates the bending deformation of the IPMC when a voltage is applied. Referring to this, when the positive electrode is connected and a voltage of 0.01 to 5.00 V is applied to drive the IPMC, a bending, at which the positively charged electrode is bent in the connected direction, occurs. This driving principle is as follows. When voltage is applied to the IPMC, the cations present therein move toward the electrode of the IPMC that is negatively charged in the state of hydrated cation 321 in water, and thus the imbalance of ion concentration generated thereby causes osmotic pressure, and the amount of water molecules 322 that move in the direction of the electrode is also increased. Accordingly, bending deformation occurs as the negatively charged electrode side expands and the positively charged electrode side contracts.

In the present invention, the application range of the voltage is 0.01 to 5.00V, preferably 1.00 to 1.23V. When the applied voltage is less than 0.01V, there is a problem that internal short circuit evaluation is impossible because bending deformation due to sufficient voltage application does not occur, and when the voltage is higher than 5V, there is a problem that deformation or decomposition reaction of IPMC, which is an electroactive polymer, occurs.

On the other hand, the total thickness of the IPMC is preferably 1 to 100 μm. If the thickness is less than 1 μm, there is a problem that the internal short circuit does not occur because the degree of damage of the separator due to the bending deformation is insufficient, and if it exceeds 100pm, there is a problem that the insertion into the battery is not easy due to a large thickness.

In the present invention, both platinum electrodes of the IPMC are connected to an external conductor connected to the outside, and the internal short circuit evaluation is performed by bending deformation by applying a voltage through the external conductor.

The performance of the IPMC may vary depending on various factors such as the material of the polymer electrolyte membrane, the metal electrode, the interface between the electrolyte and the electrode, the internal solution, the applied voltage, and the frequency.

In the present invention, the polymer electrolyte membrane may include one selected from the group consisting of: sulfonated tetrafluoroethylene including Nafion, Flemion and Aciplex;

sulfonated styrenic block copolymer including sulfonated poly (styrene-co-ethylene) (SPSE);

sulfonated styrenic triblock copolymer including sulfonated poly (styrene-b-ethylene-co-butylene-b-styrene) (SSEBS);

sulfonated styrenic pentablock copolymer (SSPB);

a blend (PMSI/PVDF) of styrene-maleimide alternating copolymer with polyvinylidene fluoride (PVDF); and a blend (SPEEK/PVDF) of sulfonated poly (ether ether ketone) with polyvinylidene fluoride (PVDF).

Most preferably, nafion is used.

First, Nafion, Flemion and Aciplex are all sulfonated tetrafluoroethylene, and the structure thereof is as follows.

Nafion is most desirable because it has a unique chemical structure, high ionic conductivity, excellent thermal, chemical and mechanical stability. Flemion and asyplex have a structure similar to nafion.

On the other hand, when using nafion as a polymer electrolyte membrane, one selected from the group consisting of montmorillonite (MMT), silica, alumina, carbon nanotube (CNT), fullerene (C60), graphene may be further included.

In addition, the polymer electrolyte membrane may include water or an ionic liquid. Ionic liquids are salts that exist in the liquid state at room temperature and have low volatility, water-like viscosity and high conductivity.

On the other hand, it is preferable to use one selected from the group consisting of palladium, silver, gold and platinum as the metal electrode deposited on the polymer electrolyte membrane. Most preferably it is desirable to deposit platinum. The platinum electrode is deposited on the polymer electrolyte membrane to protect it from acid and corrosive environments.

As a method of depositing the metal electrode on the polymer electrolyte membrane, there are mechanical compression, electrochemical, and chemical deposition methods. Typically, it is preferable to use an electroless plating method.

The metal electrode is expensive, and due to the complexity of the plating method, it is also possible to use a conducting polymer such as carbon nanotubes as the electrode instead of the metal electrode.

In the present invention, a cylindrical or pouch type battery cell may be used as a secondary battery cell in which the IPMC is installed and positioned, but is not limited thereto.

Figure 1:
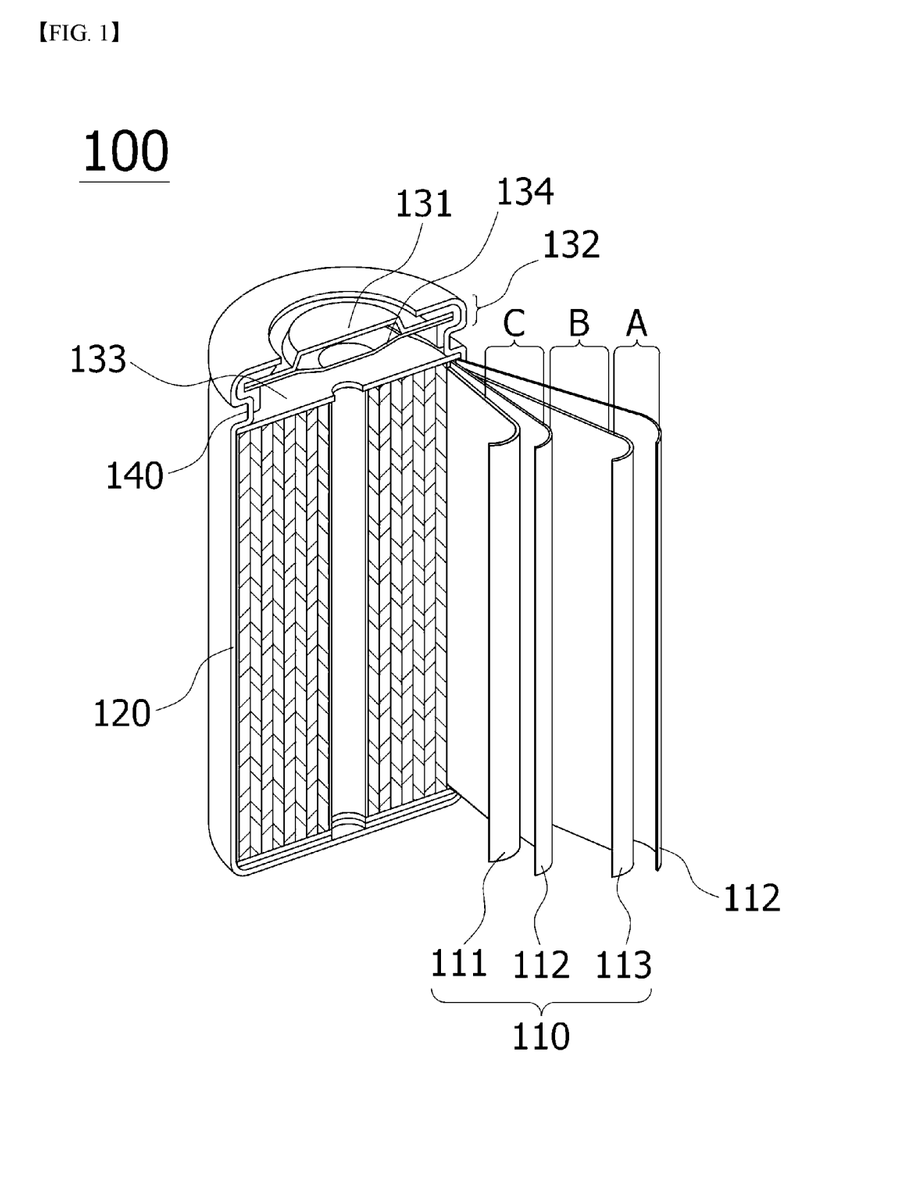
FIG. 1 is a diagram schematically illustrating the structure of a cylindrical battery cell in which an ionic polymer-metal composite (IPMC) according to the present invention is inserted and positioned.

FIG. 1 is a diagram schematically showing the structure of a typical cylindrical battery cell into which the ionic polymer-metal composite according to the present invention can be inserted.

Referring to FIG. 1, in the cylindrical battery cell 100, a jelly-roll type (wound) electrode assembly 110 is accommodated in a receiving portion of the cylindrical can 120, the electrolyte is injected into the receiving portion so that the electrode assembly 110 is completely immersed in the cylindrical can 120, and a cap assembly 132 is mounted and coupled to an open top end of the cylindrical can 120.

The electrode assembly 110 has a structure in which a positive electrode 113, a separator 112, and a negative electrode 111 are sequentially stacked and wound in a round shape, and a cylindrical center pin (not shown) may be inserted into the center of the electrode assembly 110. The center pin is generally made of a metal material to impart a predetermined strength, and has a hollow cylindrical structure in which a plate is rounded. In some cases, the center pin may be removed after welding the electrode of the electrode assembly 110 to the cylindrical can 120 or the cap assembly 132.

The cap assembly 132 has a structure in which the upper cap 131 and the internal pressure drop safety vent are in close contact with each other at the inside of the airtight gasket mounted on the upper inner surface of the crimping part and the beading part 140 of the cylindrical can 120, the upper cap 131 protrudes upward and serves as a positive electrode, and a plurality of through-holes through which the gas inside the can may be discharged may be formed along the periphery of the protrusion. In addition, a positive electrode tab protrudes from the insulating plate in the upper axial direction at the center of the electrode assembly 110 to be electrically connected to the upper cap 131 of the cap assembly 132 to apply an electric current. Further, a safety vent 134 is a thin film structure through which a current flows, and a central portion thereof is recessed to form an indented central portion, and two notches reaching depths are formed at the upper and lower bending portions of the central portion.

An insulating plate 133 is mounted on the upper surface of the electrode assembly 110 to prevent contact with the electrode lead, thereby preventing a short circuit due to contact between the electrode assembly 110 and the electrode lead.

The cylindrical can 120 may be made of metal, preferably made of stainless steel. In addition, the cylindrical can 120 may include a receiving unit in which the electrode assembly 110 may be accommodated, and the upper end part may be open.

On the other hand, the positive electrode tab of the electrode assembly 110 is protruded in the upper axial direction from the insulating plate 133 to be coupled to the upper cap of the cap assembly by spot welding and may be electrically connected to make the electricity. In addition, the negative electrode tab of the electrode assembly may be spot welded to the lower inner surface of the cylindrical can and electrically connected to apply electric current.

Figure 2:
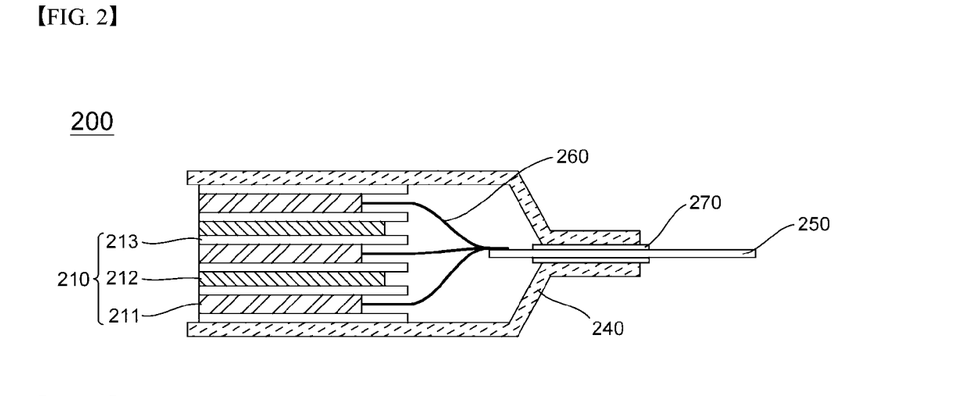
FIG. 2 is a diagram schematically showing a structure of a pouch-type battery cell in which an ionic polymer-metal complex is inserted according to the present invention.

FIG. 2 is a diagram schematically showing a structure of a pouch-type battery cell in which an ionic polymer-metal complex is inserted according to the present invention.

The pouch-type battery cell 200 includes an electrode including a positive electrode plate 211 and a negative electrode plate 212 in a state in which an electrode active material is filled in a grid, and an electrode assembly 210 in which the separator 213 in which the electrolyte interposed between the positive electrode plate 211 and the negative electrode plate 212 is impregnated is alternately stacked. In this case, a positive electrode tab 260 is formed at one side of the positive electrode plate 211, a negative electrode tab (not shown) is formed at one side of the negative electrode plate 212, and the positive electrode tab 260 and the negative electrode tab are arranged side by side at regular intervals. The tabs are connected to an external circuit by connecting to the positive electrode lead 250 and the negative electrode lead (not shown), respectively. The electrode assembly 210, the positive electrode lead 250, and the negative electrode lead are sealed by a pouch 240, which is a battery case in which a cover is formed. In addition, an insulating film may be attached to upper and lower portions of the positive electrode lead and the negative electrode lead to increase the sealing degree with the pouch and to secure the electrical insulation state. The pouch 260 has a form in which heat adhesive materials are stacked on upper and lower surfaces of an aluminum thin film, and the inside of the pouch 260 is sealed by mutual bonding of the heat adhesive materials. In this case, a portion of the positive electrode lead 260 and the negative electrode lead is sealed by the pouch 240 in an exposed state to the outside for electrical connection with the outside of the electrode assembly 210.

The battery case is typically made of an aluminum laminate sheet, provides a space for accommodating the electrode assembly, and has a pouch shape as a whole. The pouch-type battery cell may be manufactured by embedding an electrode assembly in an receiving portion of a battery case and injecting an electrolyte and heat-fusing an outer circumferential surface on which the upper laminate sheet and the lower laminate sheet of the battery case contact each other.

Looking at the battery case of the laminate sheet structure in more detail, it consists of an inner sealant layer for sealing, a metal layer for preventing the penetration of materials, and an outer resin layer forming the outermost of the case. Among them, the inner sealant layer is thermally fused to each other by applied heat and pressure in a state in which the electrode assembly is embedded, and serves to provide a sealability, and mainly consists of CPP (non-stretched polypropylene film). The metal layer serves to prevent air, moisture, and the like from flowing into the battery, and mainly aluminum (Al) is used. In addition, since the outer resin layer serves to protect the battery from the outside, excellent tensile strength and weather resistance to the thickness are required, and ONy (stretched nylon film) is frequently used.

Next, a method of installing the IPMC according to the present invention inside the battery will be described.

Figure 4:
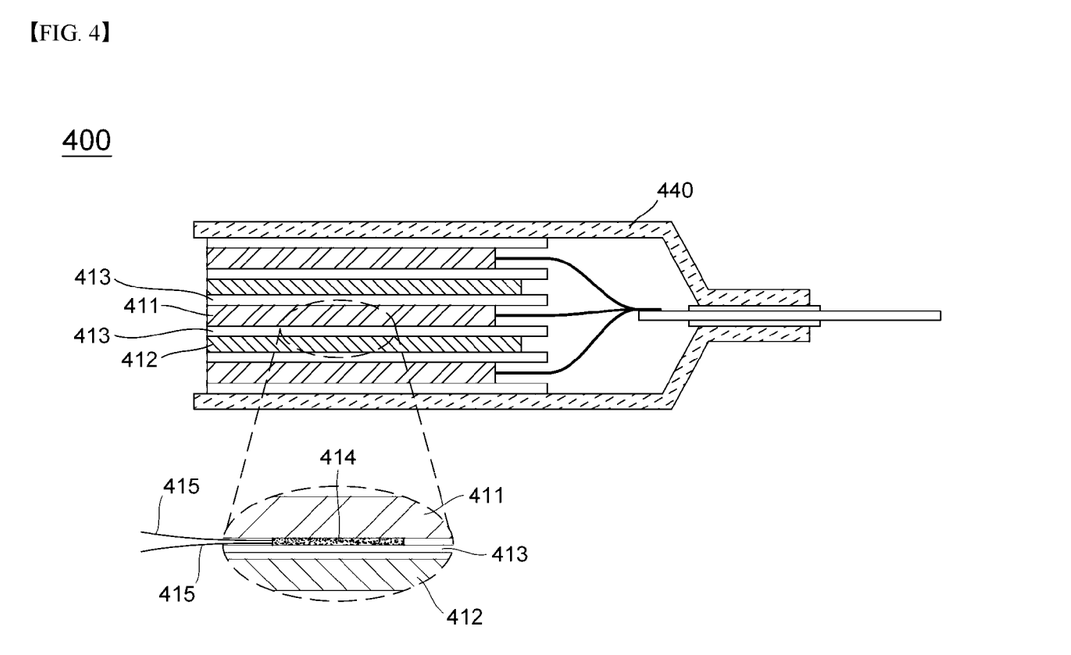
FIG. 4 is a diagram schematically showing a position where an ionic polymer-metal composite according to the present invention is installed between a separator and an electrode.

FIG. 4 is a diagram schematically illustrating that an ion polymer-metal complex (IPMC) is installed between a separator and an electrode, that is, between a separator and a positive electrode or between the separator and a negative electrode according to an embodiment of the present invention. In the present invention, an electroactive polymer ionic polymer-metal composite (IPMC) is inserted into one or more places between the separator and the electrode to induce an internal short circuit by applying an electric current to the positive electrode and the negative electrode.

Referring to FIG. 4, the IPMC 414 is inserted between the positive electrode 411 and the separator 413 of the pouch-type battery cell 400 while being connected to an external conductor 415 exposed to the outside of the battery. The IPMC is in contact with one surface of the positive electrode and one surface of the separator, and may be inserted and positioned between the negative electrode 412 and the separator 413 instead of the positive electrode. The IPMC may be installed at one or more places in the space between the positive electrode and the separator, or between the negative electrode and the separator, and there is no particular limitation on the number of installations.

The platinum electrode located on both sides of the polymer electrolyte membrane containing Nafion is preferably used as the IPMC.

The IPMC generally has an end portion which is not connected to an external conductor and is generally perpendicular to the longitudinal direction. However, the IPMC may have a pointed end portion to easily perforate the separator when voltage is applied. If one side of the separator is damaged by bending of the IPMC due to voltage application, an internal short circuit may occur due to contact with the electrode on the back side of the separator. This easily damages the separator, and the shape of the end of the IPMC is not limited as long as it can be in contact with the electrode on the back of the separator.

In addition, when the voltage is applied through the external conductor, the IPMC is bent toward the platinum electrode to which the positive voltage is applied. Therefore, it is preferable to apply the positive voltage to the external conductor connected to the platinum electrode in contact with the separator of the IPMC. It is because, in the case that the platinum electrode to which the positive voltage is applied is the platinum electrode on the positive electrode or the negative electrode side instead of the separator side, even if bending occurs, the internal short circuit intended in the present invention does not occur.

Figure 5:
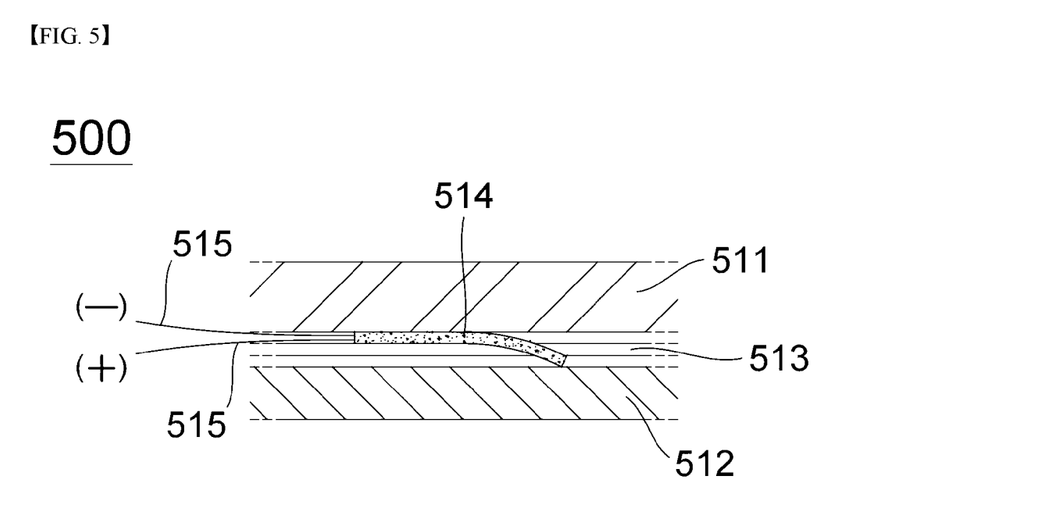
FIG. 5 is a schematic diagram illustrating an internal short circuit caused by bending deformation between the separator and the electrode of the ionic polymer-metal composite of the present invention.

FIG. 5 is a schematic diagram showing that the internal short circuit occurs due to the bending deformation of the IPMC, which is the electroactive polymer, between the separator and the electrode. Referring to FIG. 5, it can be seen that after the IPMC is installed, an internal short circuit occurs due to bending deformation as shown in FIG. 4.

Specifically, the IPMC 514 connected to the external conductor 515 is installed between the positive electrode 511 and the separator 513 and generates bending of the IPMC 514 by applying a voltage to the external conductor 515. Here, by applying a voltage to the external conductor 515 connected to the platinum electrode of the IPMC 514 in contact with the separator 513, the IPMC 514 is bent toward the separator 513, and as a result, the separator 513 is torn. The IPMC 514 penetrates through the torn separator 513 and comes into contact with the negative electrode 512 beyond the separator. As a result, one surface of the IPMC is in contact with the positive electrode 511, and the other side is in contact with the negative electrode 512, so that energization occurs and an internal short circuit occurs.

According to another embodiment of the present invention, the IPMC may be installed between the separator and the negative electrode.

Figure 6:
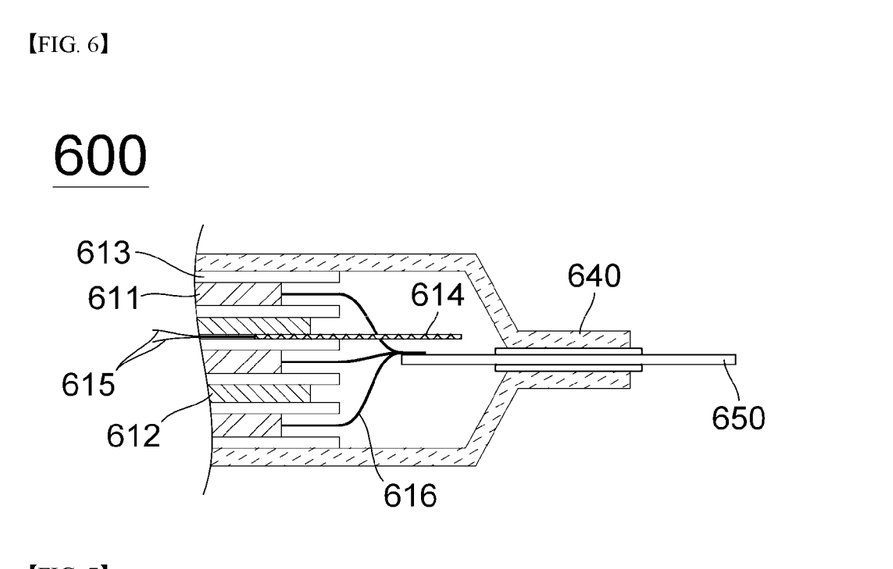
FIG. 6 is a diagram schematically showing a position where an ionic polymer-metal composite according to the present invention is installed between a separator and a negative electrode.

FIG. 6 is a diagram schematically showing a position where an ionic polymer-metal composite according to the present invention is installed between a separator and a negative electrode. In the present invention, a long electroactive polymer IPMC is inserted into one or more places between the separator and the negative electrode to induce an internal short circuit by energizing the negative electrode and positive electrode lead.

Referring to FIG. 6, an IPMC 614 having a long length is positioned between one surface of the negative electrode 612 and the separator 613. In the positive electrode 613, the positive electrode tabs 616 are collected and welded to one surface of the positive electrode lead 650. In this case, the positive electrode tabs 616 and the IPMC 614 are not in contact with each other without overlapping each other. That is, the other end of the IPMC is not in contact with the positive electrode tab and the positive electrode lead.

The IPMC 614 is connected to the external conductor 615 exposed to the outside of the battery, and when a voltage is applied to the external conductor, bending occurs in the direction of the platinum electrode to which a positive voltage is applied. Specifically, a positive voltage is applied to the external conductor 615 connected to the platinum electrode of the IPMC. The bending of the IPMC is formed in a direction in which a positive voltage is applied, and the application direction of the positive voltage is set to be a direction toward the positive electrode lead 650. When the application direction of the positive voltage is directed toward the battery case 640 instead of the negative electrode lead 650, the IPMC is bent toward the battery case so that an internal short circuit intended in the present invention does not occur.

Figure 7:
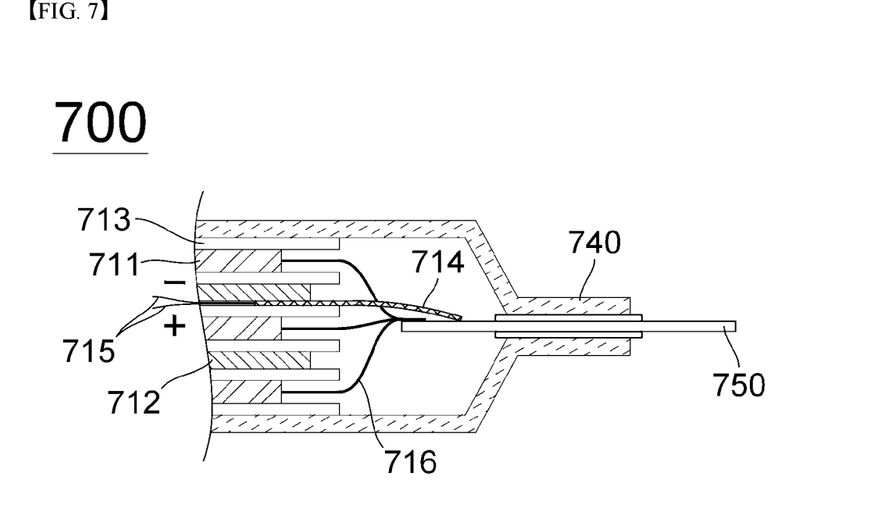
FIG. 7 is a schematic diagram illustrating an internal short circuit caused by contact between a negative electrode and a positive electrode lead due to bending deformation of the ionic polymer-metal composite of the present invention.

FIG. 7 is a schematic diagram illustrating an internal short circuit caused by contact between a negative electrode and a positive electrode lead due to bending deformation of the ionic polymer-metal composite of the present invention. Referring to FIG. 7, it can be seen that, after the IPMC is installed as shown in FIG. 6, an internal short circuit occurs due to bending deformation.

Specifically, the IPMC 714 connected to the external conductor 715 is disposed between the negative electrode 712 and the separator 713, and bending of the IPMC 714 occurs by applying a voltage to the external conductor 715. The long stretched IPMC 714 is bent toward the positive electrode lead 750 by applying a voltage such that positive charge flows to the external lead 715 connected to the platinum electrode of the IPMC 714 toward the positive electrode lead 750.

In the present invention, the length of the IPMC 714 is sufficiently long to be able to contact the electrode lead through bending, thereby energizing the electrode and the electrode lead.

In detail, in FIG. 7, the IPMC 714 contacts the positive electrode lead 750 through bending, and as a result, energization occurs as the negative electrode 712 and the positive electrode lead 750 contact each other by the IPMC, which causes an internal short circuit.

According to another embodiment of the present invention, the IPMC may be installed between the separator and the positive electrode.

Figure 8:
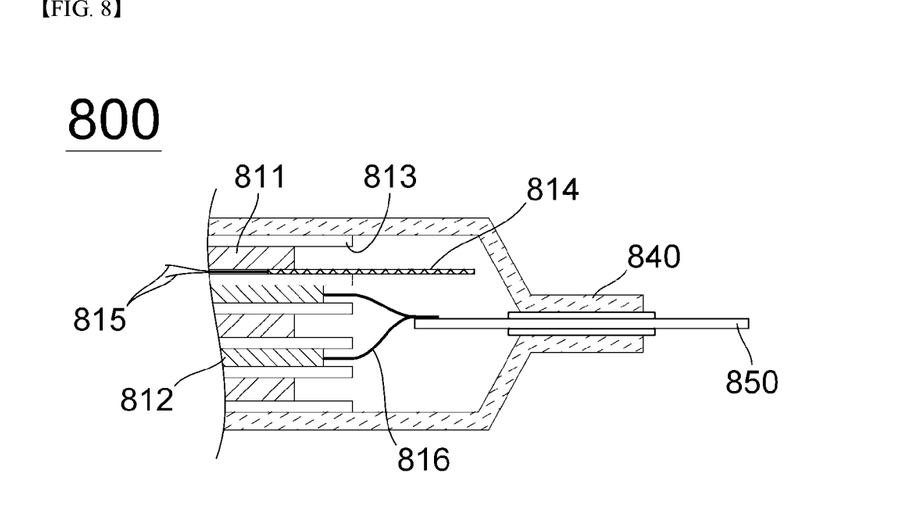
FIG. 8 is a diagram schematically showing a position where an ionic polymer-metal composite according to the present invention is installed between a separator and a positive electrode.

FIG. 8 schematically shows that the ionic polymer-metal composite according to the present invention is installed between a separator and a positive electrode. In the present invention, a long electroactive polymer IPMC is inserted into one or more places between the separator and the positive electrode to induce an internal short circuit by energizing the positive electrode and negative electrode lead.

Referring to FIG. 8, an IPMC 814 having a long length is positioned between one surface of the positive electrode 811 and the separator 813. In the negative electrode 812, the negative electrode tabs 816 are collected and welded to one surface of the negative electrode lead 850. In this case, the negative electrode tabs 816 and the IPMC 814 are not in contact with each other without overlapping each other. That is, the other end of the IPMC is not in contact with the negative electrode tab and the negative electrode lead.

The IPMC 814 is connected to the external conductor 815 exposed to the outside of the battery, and when a voltage is applied to the external conductor, bending occurs in the direction of the platinum electrode to which a positive voltage is applied. Specifically, a positive voltage is applied to the external conductor 815 connected to the platinum electrode of the IPMC. The bending of the IPMC is formed in a direction in which a positive voltage is applied, and the application direction of the positive voltage is set to be a direction toward the negative electrode lead 850. When the application direction of the positive voltage is directed toward the battery case 840 instead of the negative electrode lead 850, the IPMC is bent toward the battery case so that an internal short circuit intended in the present invention does not occur.

Figure 9:
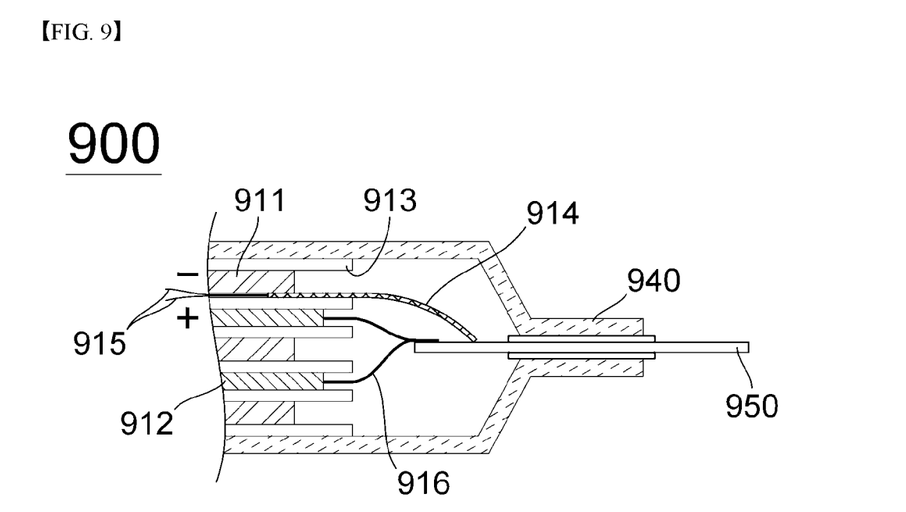
FIG. 9 is a schematic diagram illustrating an internal short circuit caused by contact between a positive electrode and a negative electrode lead due to bending deformation of the ionic polymer-metal composite of the present invention.

FIG. 9 is a schematic diagram illustrating an internal short circuit caused by contact between a positive electrode and a negative electrode lead due to bending deformation of the ionic polymer-metal composite of the present invention. Referring to FIG. 8, it can be seen that, after the IPMC is installed as shown in FIG. 8, an internal short circuit occurs due to bending deformation.

Specifically, the IPMC 814 connected to the external conductor 915 is installed between the positive electrode 911 and the separator 913 and generates bending of the IPMC 914 by applying a voltage to the external conductor 915. The long stretched IPMC 914 is bent toward the negative electrode lead 950 by applying a voltage such that positive charge flows to the external lead 915 connected to the platinum electrode of the IPMC 914 toward the negative electrode lead 950.

In the present invention, the length of the IPMC 914 is sufficiently long to be able to contact the electrode lead through bending, thereby energizing the electrode and the electrode lead.

In detail, in FIG. 9, the IPMC 914 contacts the negative electrode lead 950 through bending, and as a result, energization occurs as the positive electrode 911 and the negative electrode lead 950 contact each other by the IPMC, which causes an internal short circuit.

An internal short circuit evaluation method according to the present invention includes: a step of preparing an ionic polymer-metal composite (IPMC) connected to an external conductor exposed to the outside of the battery cell; a step of installing and placing the ionic polymer-metal composite in the cell; a step of applying a voltage to an external conductor connected to the ionic polymer-metal composite (IPMC); and a step of evaluating the internal short circuit by measuring the voltage of the battery cell.

When voltage is applied to the ionic polymer-metal composite of the present invention, bending deformation occurs to induce energization, thereby lowering the battery cell voltage. The occurrence of the internal short circuit can be determined by the difference (voltage drop width) with the voltage after the internal short circuit occurs as compared with before the internal short circuit occurs. The voltage drop of the battery cell can be measured using a voltmeter and is not particularly limited as a device capable of measuring the pressure inside the battery.

In the present invention, IPMC is used as the electroactive polymer, but is not limited thereto.

In the present invention, it is possible to evaluate the internal short circuit at room temperature and normal pressure, and by controlling the IPMC by voltage, there is an advantage that the influence of the internal and external environment is not significant.

In addition, it is possible to adjust the appropriate voltage range depending on the electroactive polymer used.

As the length of the IPMC increases, the damage area of the separator tends to increase as the degree of bending increases, so that it is possible to adjust a desired damage area. In addition, as a voltage corresponding to an experimenter-desired short circuit time is applied, an internal short circuit occurs, resulting in an internal short circuit evaluation according to a desired location, area, and time, which is an advantage.

DESCRIPTION OF SYMBOLS

| | |
|---|---|
| 100: battery cell | 110: electrode assembly |
| 111: negative electrode | 112: separator |
| 113: positive electrode | 120: cylindrical can |
| 131: upper cap | 132: cap assembly |
| 133: insulating plate | 134: safety vent |
| 140: crimping part and beading part | 200: pouch-type battery cell |
| 210: electrode assembly | 211: positive electrode plate |
| 212: negative electrode plate | 213: separator |
| 240: pouch | 250: positive electrode lead |
| 260: positive electrode tab | 270: insulating film |
| 300, 300a, 300b: IPMC | 310: metal electrode |
| 320: polymer electrolyte membrane | 321: cation |
| 322 water molecule | 400: pouch-type battery cell |
| 411: positive electrode | 412: negative electrode |
| 413: separator | 414: IPMC |
| 415: external conductor | 440: battery case |
| 500: battery cell | 511: positive electrode |
| 512: negative electrode | 513: separator |
| 514: IPMC | 515: external conductor |
| 600: battery cell | 611: positive electrode |
| 612: negative electrode | 613: separator |
| 614: IPMC | 615: external conductor |
| 616: positive electrode tab | 640: battery case |
| 650: positive electrode lead | |
| 700: battery cell | 711: positive electrode |
| 712: negative electrode | 713: separator |
| 714: IPMC | 715: external conductor |
| 716: positive electrode tab | 740: battery case |
| 750: positive electrode lead | |
| 800: battery cell | 811: positive electrode |
| 812: negative electrode | 813: separator |
| 814: IPMC | 815: external conductor |
| 816: negative electrode tab | 840: battery case |
| 850: negative electrode lead | |
| 900: battery cell | 911: positive electrode |
| 912: negative electrode | 913: separator |
| 914: IPMC | 915: external conductor |
| 916: negative electrode tab | 940: battery case |
| 950: negative electrode lead | |

The invention claimed is:

1. A method for evaluating an internal short circuit of a secondary battery cell having a structure in which an electrode assembly of a positive electrode, separator and negative electrode is embedded in a battery case, and an electrode tab of the electrode assembly is bonded to an electrode lead, wherein the electrode lead is sealed by the battery case and protrudes outside of the battery case, the method comprising:
    inserting an ionic polymer-metal composite (IPMC) into the battery cell; and
    inducing an internal short circuit due to bending deformation of the ionic polymer-metal composite (IPMC) by applying a voltage to an external conductor electrically connected to the ionic polymer-metal composite (IPMC).

2. The method of claim 1, wherein the ionic polymer-metal composite (IPMC) is formed of a metal electrode coated on both sides of a polymer electrolyte membrane,
    wherein the polymer electrolyte membrane comprises one selected from the group consisting of:
    sulfonated tetrafluoroethylene including Nafion®, Flemion® and Aciplex®;
    sulfonated styrenic block copolymer including sulfonated poly (styrene-co-ethylene) (SPSE);

sulfonated styrenic triblock copolymer including sulfonated poly (styrene-b-ethylene-co-butylene-b-styrene) (SSEBS);

sulfonated styrenic pentablock copolymer (SSPB);

a blend of styrene-maleimide alternating copolymer with polyvinylidene fluoride (PMSI/PVDF); and a blend of sulfonated poly (ether ketone) with polyvinylidene fluoride (SPEEK/PVDF).

3. The method of claim 2, wherein one selected from the group consisting of montmorillonite (MMT), silica, alumina, carbon nanotube (CNT), fullerene (C60), and graphene is mixed with the Nafion®.

4. The method of claim 2, wherein the metal electrode comprises one selected from the group consisting of platinum, gold, palladium, and silver.

5. The method of claim 1, wherein the ionic polymer-metal composite (IPMC) is inserted into at least one position between the separator and the positive electrode or between the separator and the negative electrode to induce an internal short circuit by energizing the positive electrode and the negative electrode.

6. The method of claim 1, wherein the ionic polymer-metal composite (IPMC) is inserted into at least one position between the separator and the negative electrode to induce an internal short circuit by energizing a positive electrode lead and the negative electrode.

7. The method of claim 1, wherein the ionic polymer-metal composite (IPMC) is inserted into at least one position between the separator and the positive electrode to induce an internal short circuit by energizing a negative electrode lead and the positive electrode.

8. The method of claim 1, wherein an occurrence of the internal short circuit is detected by detecting a voltage drop.

9. The method of claim 1, wherein an application range of the voltage is 0.01 to 5.00 V.

10. The method of claim 9, wherein an application range of the voltage is 1 to 1.23 V.

* * * * *